United States Patent
Gerstenhaber et al.

(10) Patent No.: US 7,432,766 B2
(45) Date of Patent: Oct. 7, 2008

(54) FRONT END FOR AN INSTRUMENTATION AMPLIFIER

(75) Inventors: Moshe Gerstenhaber, Newton, MA (US); Padraig Cooney, Medford, MA (US)

(73) Assignee: Analog Devices, Inc., Norwood, MA (US)

( * ) Notice: Subject to any disclaimer, the term of this patent is extended or adjusted under 35 U.S.C. 154(b) by 19 days.

(21) Appl. No.: 11/671,124

(22) Filed: Feb. 5, 2007

(65) Prior Publication Data

US 2008/0186102 A1    Aug. 7, 2008

(51) Int. Cl.
    *H02H 7/20* (2006.01)
(52) U.S. Cl. .......................... 330/298; 330/69
(58) Field of Classification Search ............ 330/69, 330/207 P, 252, 261, 298
    See application file for complete search history.

(56) References Cited

U.S. PATENT DOCUMENTS 5,075,633 A    12/1991  Bowers
5,142,242 A *  8/1992  Schaffer .................. 330/253
5,451,902 A *  9/1995  Huang et al. ............. 330/253
7,248,116 B2 * 7/2007  Chiu ....................... 330/253

OTHER PUBLICATIONS

Analog Devices, Inc., "Precision, Low Cost, High Speed, BiFET Op Amp" AD711, pp. 1-14, 2002.
Analog Devices, Inc., "Precision Instrumentation Amplifier" AD524, pp. 1-16, 1999.

* cited by examiner

*Primary Examiner*—Henry K Choe
(74) *Attorney, Agent, or Firm*—Gauthier & Connors LLP

(57) ABSTRACT

An amplifier system includes an instrumentation amplifier arrangement being designed to amplify the difference between two voltage inputs with a defined gain, and to produce a single-ended output referenced to a known reference point. A front end circuit is coupled to the instrumentation amplifier. The front end circuit is configured to include a current clamp to actively limit the current in a gain resistor of the instrumentation amplifier to prevent input currents flowing when the instrumentation amplifier is over-driven.

8 Claims, 2 Drawing Sheets

FRONT END FOR AN INSTRUMENTATION AMPLIFIER

BACKGROUND OF THE INVENTION

The invention relates to the field of instrumentation amplifiers, and in particular to a front end for an instrumentation amplifier that inhibits input currents.

Instrumentation amplifiers are designed to amplify the difference between two voltage inputs with a defined gain, and to produce a single-ended output referenced to a known reference point, usually ground. Implementing an instrumentation amplifier in a general purpose fashion is somewhat complex using conventional operational amplifiers (op amps). A classic three op amp implementation is shown in FIG. 1. A pair of input op amps A1 and A2 receive input signals $V_{INP}, V_{INM}$ at their respective non-inverting inputs, while their inverting inputs are tied together through a gain resistor Rg. Each op amp A1, A2 has a respective feedback resistor Rfb connected between its output and its inverting input. The outputs of A1 and A2 are connected through respective resistors R1 and R2 to the noninverting and inverting inputs of a third op amp A3, respectively, with another resistor R3 tapped off the noninverting input of A3 to a voltage reference $V_{ref}$ (normally ground potential). The circuit output is taken from the output of A3, which includes a feedback resistor R4 to its inverting input. Voltage supplies V+ and V− provide the required supply voltages to each of the op amps.

Assuming R1, R2, R3 and R4 are equal, the overall transfer function for the circuit of FIG. 1 is:

$$V_0 - V_{ref} = (V_{INP} - V_{INM})(2Rfb/Rg+1) \qquad \text{EQ. 1}$$

This transfer function is somewhat awkward from a resistor value viewpoint, and additionally can never have a gain of less than unity. Two other significant drawbacks of the circuit are that the common mode input range reduces in the presence of a differential signal, and R1-R4 all have to match extremely well for good common mode rejection; any trimming performed on these resistors interacts with the gain equation.

Another restriction associated with the conventional instrumentation amplifier circuit is in the area of supply voltages. The amplifier's output should be able to swing at least down to ground. However, because of the amplifier's output resistance, its output voltage cannot be brought down to ground unless the negative supply voltage is less than ground. This requirement is not a problem if there are two supply voltages available (V+ and V−). In some instances, such as with most disk drives, there is only a single voltage supply available (V+), and V− must be set at ground. The standard instrumentation amplifier is not applicable to these situations.

Another major problem with instrumentation amplifiers have traditionally been controlling input currents into these devices. Prior art practices degrade performance and do not eliminate the input currents. Resistors in series with the inputs introduce noise, offset, drift, and also need to be able to take the large currents that will into the instrumentation amplifiers.

SUMMARY OF THE INVENTION

According to one aspect of the invention, there is provided an amplifier system. The amplifier system includes an instrumentation amplifier arrangement being designed to amplify the difference between two voltage inputs with a defined gain, and to produce a single-ended output referenced to a known reference point. A front end circuit is configured to include a current clamp to actively limit the current in a gain resistor of the instrumentation amplifier to prevent input currents flowing when the instrumentation amplifier is over-driven.

According to another aspect of the invention, there is provided a method of forming an amplifier system. The method includes providing an instrumentation amplifier arrangement being designed to amplify the difference between two voltage inputs with a defined gain, and to produce a single-ended output referenced to a known reference point. Also, the method includes providing a front end circuit being coupled to the instrumentation amplifier. The front end circuit is configured to include a current clamp to actively limit the current in a gain resistor of the instrumentation amplifier to prevent input currents flowing when the instrumentation amplifier is over-driven.

DETAILED DESCRIPTION OF THE INVENTION

The invention provides a front end circuit to prevent input currents during input over-drive.

Figure 1:
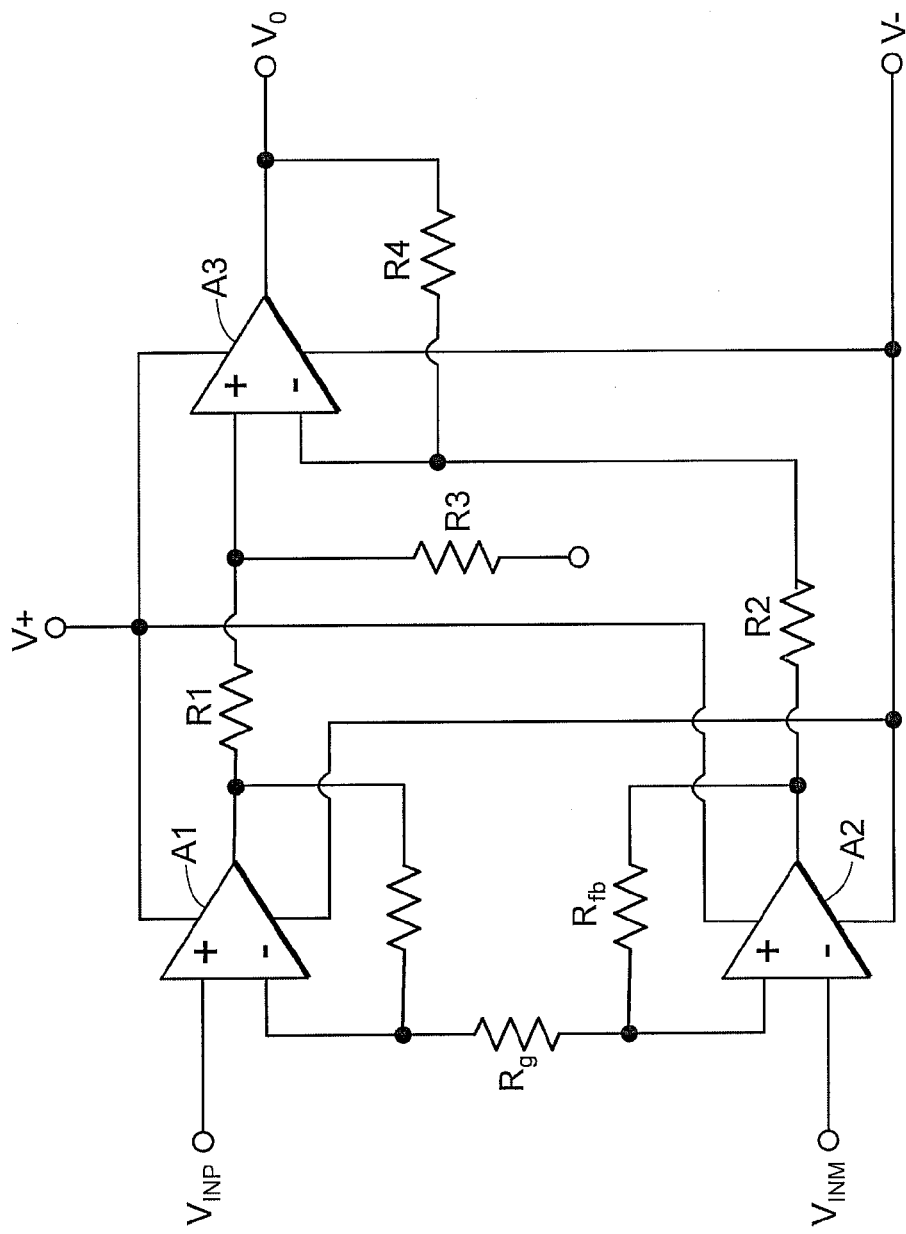
FIG. 1 is a schematic diagram illustrating a classic three op amp implementation.
Figure 2:
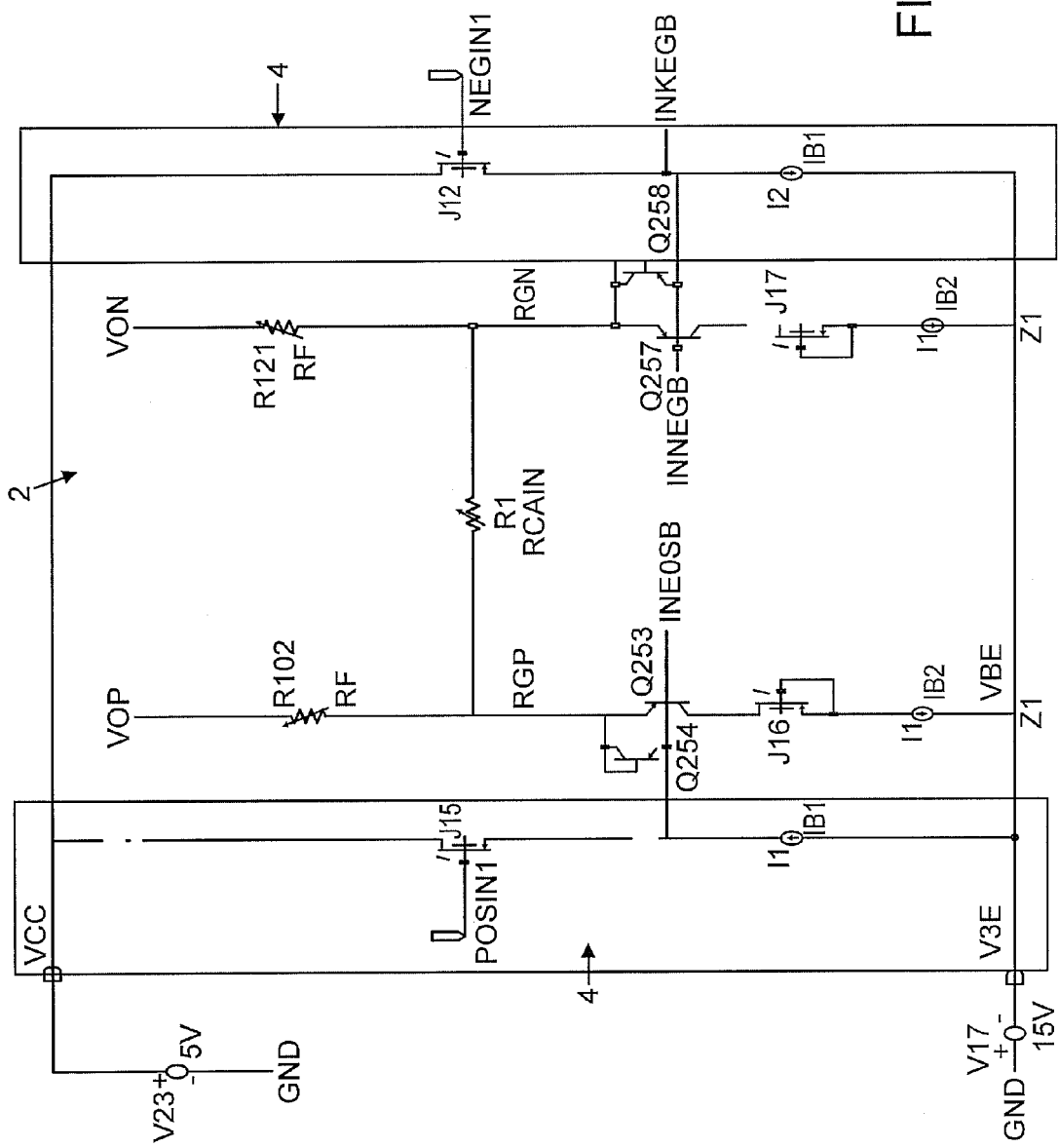
FIG. 2 is a schematic diagram showing a novel front end circuit of an instrumentation amplifier.

FIG. 2 shows novel front end circuit 2 of an instrumentation amplifier. The circuit 2 includes a JFET J15 whose drain is coupled to a voltage VCC. In this embodiment, the instrumentation amplifier may include a gain of 1000 and a 15V differential input voltage. The gate of JFET J15 is coupled to an input voltage source POSIN1 of the circuit 2 that is associated with an input to the instrumentation amplifier, and the source of JFET J15 is coupled to a current source I1. The circuit 2 includes a resistor R102 being coupled to a voltage VOP associated with the output of input op-amp. The other end of the resistor R102 is connected to a resistor RGAIN and the emitter of a pnp bipolar transistor Q253. The collector of transistor Q253 is coupled to the drain of JFET J16. The base of transistor Q253 is coupled to current source I1. The gate and source of JFET 16 is coupled to a current source I3. Also, both current sources I1 and I3 are coupled to voltage VEE. The base and collector of a pnp bipolar transistor Q254 is coupled to the emitter of transistor Q253. The emitter of transistor Q254 is coupled to the base of transistor Q253 and the source of JFET J15.

A resistor RGAIN is coupled to the emitter of transistor Q253 and resistor R102 at point RGP at one end and is coupled to a resistor R121 and the emitter of a pnp bipolar transistor Q257 at a point RGN. The resistors 102 and 121 are valued at RF and points RGN and RPN are the inverting terminals of the op-amps used by the instrumentation amplifier. The other end of resistor 121 is coupled to voltage VON associated with the output of the input op-amps used by instrumentation amplifier 2. The collector of transistor Q257 is coupled to the drain of JFET J17, and the base of transistor Q257 is coupled to current source I2. The collector and base of a pnp bipolar transistor Q259 is coupled to the emitter of transistor Q257. The emitter of transistor Q259 is coupled to the current source I2. The gate and source of JFET J17 is coupled to a current source I4. The current source I4 is coupled to voltage VEE.

A second portion of the front end circuit 2 includes a JFET J12 whose drain is coupled to voltage VCC. The gate of JFET J12 is coupled to the voltage source NEGINI1, and the source of JFET J12 is coupled to the current source I2. The current source I2 is also coupled to voltage VEE.

The invention uses a current clamp implemented in the front end circuit 2 using the JFETs J16 and J17 to actively limit the current in the resistor RGAIN to prevent input currents flowing in JFET J15 and J12 when the instrumentation amplifier is over-driven. The current of the resistor RGAIN cannot exceed a maximum clamp current plus the current passing thru the resistors 102 and 121. Without the current clamp provided by the circuit 2, the current of resistor RGAIN is limited only by the current source I2 and I1, and the beta of the transistors Q257 and Q253.

In other embodiments, the JFET and bipolar transistors can be replaced with other transistor structures that perform similar functionality.

The advantage of the invention is that the current clamp provided in the front end circuit 2 effectively works to prevent input currents without degrading performance in an over-driven condition. The only cost is the addition of the current clamps and these take very little die area. Prior art practices degrade performance and do not eliminate the input currents Although the present invention has been shown and described with respect to several preferred embodiments thereof, various changes, omissions and additions to the form and detail thereof, may be made therein, without departing from the spirit and scope of the invention.

What is claimed is:

1. An amplifier system comprising:
   an instrumentation amplifier arrangement being designed to amplify the difference between two voltage inputs with a defined gain, and to produce a single-ended output referenced to a known reference point; and
   a front end circuit of said instrumentation amplifier, said front end circuit being configured to include a current clamp to actively limit the current in a gain resistor of said instrumentation amplifier to prevent input currents flowing when the instrumentation amplifier is over-driven.

2. The amplifier system of claim 1, wherein said front end circuit comprises at least one JFET transistor to form said current clamp.

3. The amplifier system of claim 2, wherein said front end circuit comprises at least one current sources being coupled to said at least one JFET transistor.

4. The amplifier system of claim 2, wherein said at least one JFET transistor receives a voltage signal associated with an input of said instrumentation amplifier to power the gate of said at least one JFET transistor.

5. A method of forming an amplifier system comprising:
   providing an instrumentation amplifier arrangement being designed to amplify the difference between two voltage inputs with a defined gain, and to produce a single-ended output referenced to a known reference point; and
   providing a front end circuit of said instrumentation amplifier, said front end circuit being configured to include a current clamp to actively limit the current in a gain resistor of said instrumentation amplifier to prevent input currents flowing when the instrumentation amplifier is over-driven.

6. The method of claim 5, wherein said front end circuit comprises at least one JFET transistor to form said current clamp.

7. The method of claim 6, wherein said front end circuit comprises at least one current sources being coupled to said at least one JFET transistor.

8. The method of claim 6, wherein said at least one JFET transistor receives a voltage signal associated with an input of said instrumentation amplifier to power the gate of said at least one JFET transistor.

* * * * *